US012784804B2

(12) United States Patent
Song

(10) Patent No.: US 12,784,804 B2
(45) Date of Patent: Nov. 3, 2026

(54) SEMICONDUCTOR SYSTEM FOR PERFORMING AN ACTIVE OPERATION USING AN ACTIVE PERIOD CONTROL METHOD

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 106 days.

(21) Appl. No.: 18/796,791

(22) Filed: Aug. 7, 2024

(65) Prior Publication Data

US 2024/0395305 A1 Nov. 28, 2024

Related U.S. Application Data

(62) Division of application No. 17/577,289, filed on Jan. 17, 2022, now Pat. No. 12,080,333.

(30) Foreign Application Priority Data

Sep. 17, 2021 (KR) ........................ 10-2021-0124925

(51) Int. Cl.

| | |
|---|---|
| ***G11C 11/406*** | (2006.01) |
| ***G11C 11/4076*** | (2006.01) |
| ***G11C 11/4096*** | (2006.01) |
| ***G11C 29/36*** | (2006.01) |

(52) U.S. Cl.

CPC .. *G11C 11/40618* (2013.01); *G11C 11/40615* (2013.01); *G11C 11/4076* (2013.01); *G11C 11/4096* (2013.01); *G11C 29/36* (2013.01)

(58) Field of Classification Search

CPC ........ G11C 11/40618; G11C 11/40615; G11C 11/4076; G11C 11/4096; G11C 11/40611; G11C 29/36; G11C 29/023; G11C 29/028; G11C 29/50012; G11C 2207/2254; G11C 2211/4061

See application file for complete search history.

(56) References Cited

U.S. PATENT DOCUMENTS

| | | | | |
|---|---|---|---|---|
| 10,210,925 | B2 | 2/2019 | Bains et al. | |
| 2002/0080677 | A1 * | 6/2002 | Watanabe | G11C 11/4085 365/201 |
| 2004/0136250 | A1 | 7/2004 | Takahashi | |
| 2006/0221745 | A1 | 10/2006 | Lee | |
| 2014/0355332 | A1 | 12/2014 | Youn et al. | |
| 2017/0316818 | A1 * | 11/2017 | Saifuddin | G11C 11/40622 |
| 2020/0152256 | A1 | 5/2020 | Seo | |
| 2020/0342934 | A1 | 10/2020 | Lee | |
| 2022/0147274 | A1 | 5/2022 | Kim et al. | |

FOREIGN PATENT DOCUMENTS

| | | |
|---|---|---|
| KR | 1020220062843 A | 5/2022 |
| KR | 1020220082704 A | 6/2022 |

* cited by examiner

*Primary Examiner* — Sultana Begum

(74) *Attorney, Agent, or Firm* — WILLIAM PARK AND ASSOCIATES LTD.

(57) ABSTRACT

A semiconductor system including: an operation period adjusting circuit configured to generate operation information for adjusting an operation period, when an input count of an active command during a test mode period is equal to or more than a preset count; and a command generation circuit configured to adjust the input count of the active command applied to a semiconductor device during a preset period, by adjusting the operation period on the basis of the operation information.

5 Claims, 18 Drawing Sheets

FIG. 5

| ACT COUNTING | tRAS | ACT INPUT |
| --- | --- | --- |
| Max * 30% | tRAS | 1,200K |
| Max * 50% | tRAS + 10n | 1,000K |
| Max * 70% | tRAS + 20n | 857K |
| Max * 90% | tRAS + 30n | 750K |
| Max | tRAS + 40n | 667K |

FIG. 15

| ACT COUNTING | tREF | REF INPUT (64ms) | REF INPUT (32ms) |
|---|---|---|---|
| Max * 30% | tREF | 64ms | 32ms |
| Max * 50% | tREF * 0.9 | 57.6ms | 28.8ms |
| Max * 70% | tREF * 0.8 | 51.2ms | 25.6ms |
| Max * 90% | tREF * 0.6 | 38.4ms | 19.2ms |
| Max | tREF * 0.5 | 32ms | 16ms |

SEMICONDUCTOR SYSTEM FOR PERFORMING AN ACTIVE OPERATION USING AN ACTIVE PERIOD CONTROL METHOD

CROSS-REFERENCES TO RELATED APPLICATIONS

The present application is a divisional application of U.S. patent application Ser. No. 17/577,289, filed on Jan. 17, 2022, which claims priority under 35 U.S.C. § 119 (a) to Korean application number 10-2021-0124925, filed on Sep. 17, 2021, which are incorporated by reference in their entirety.

BACKGROUND OF THE INVENTION

1. Technical Field

Embodiments of the present disclosure generally relate to a semiconductor system, and more particularly, to a semiconductor system for performing an active operation using an active period control method which controls an active period according to the input count of an active command.

2. Related Art

A semiconductor device includes a plurality of memory cells for storing data therein. Each of the memory cells is composed of a cell capacitor and a cell transistor. The semiconductor device stores data through an operation of charging or discharge the cell capacitor, and the amount of charge stored in the cell capacitor needs to be constantly retained at all times. However, the amount of charge stored in the cell capacitor is changed due to a voltage difference from a peripheral circuit. When the amount of charge stored in the cell capacitor is changed, it indicates that the data stored in the cell capacitor is changed. In other words, it indicates that the data is lost. In order to prevent such data loss, the semiconductor device performs a refresh operation.

With the development of processing technology, the degree of integration in semiconductor devices has gradually increased. Thus, the distance between memory cells has shrunk, and the distance between word lines coupled to the respective memory cells has shrunk. When the distance between the word lines shrinks, an interference effect may occur between adjacent word lines, which may make it difficult to retain data stored in memory cells coupled to the corresponding word lines. That is, the probability that the data will be lost increases.

SUMMARY

In one embodiment, a semiconductor system may include: an operation period adjusting circuit configured to generate operation information for adjusting an operation period, when an input count of an active command during a test mode period is equal to or more than a preset count; and a command generation circuit configured to adjust the input count of the active command applied to a semiconductor device during a preset period, by adjusting the operation period on the basis of the operation information.

In another embodiment, a semiconductor system may include: an active counting circuit configured to store a counting signal generated by counting the number of times that an active command is input during a test mode period, and generate an operation control signal for adjusting an operation period when the input count of the active command is equal to or more than a preset count; an operation information generation circuit configured to receive the operation control signal, and generate operation information for adjusting the operation period; and a test control circuit configured to generate a reset signal for resetting the counting signal when the test mode period is ended.

In another embodiment, a semiconductor system may include: a controller configured to generate an active command applied to a semiconductor device on the basis of a command; and the semiconductor device configured to adjust a smart refresh period in which word lines adjacent to an internal address are additionally activated when the input count of the active command during a test mode period is equal to or more than a preset count.

In another embodiment, a semiconductor system may include: a refresh control circuit configured to generate refresh information for adjusting a refresh period, when the input count of an active command during a test mode period is equal to or more than a preset count; and a command generation circuit configured to generate the active command applied to a semiconductor device on the basis of a command, and adjust the input period of a refresh command applied to the semiconductor device on the basis of the refresh information.

In another embodiment, an active period control method may include: detecting the input count of an active command, when a pulse of a period signal for setting a test mode period is generated; adjusting an operation period when the input count of the active command is equal to or more than a preset count; and resetting the input count of the active command, when the input count of the active command is less than the preset count.

In another embodiment, an active period control method may include: resetting the input count of an active command, when a pulse of a period signal for setting a test mode period is generated; detecting the input count of the active command before the resetting of the input count; and adjusting an operation period when the input count of the active command is equal to or more than a preset count.

In another embodiment, a refresh period control method may include: detecting the input count of an active command, when a pulse of a period signal for setting a test mode period is generated; adjusting the input period of a refresh command when the input count of the active command is equal to or more than a preset count; and resetting the input count of the active command, when the input count of the active command is less than the preset count.

In another embodiment, a refresh period control method may include: resetting the input count of an active command, when a pulse of a period signal for setting a test mode period is generated; detecting the input count of the active command, before the input count is reset; and adjusting the input period of a refresh command when the input count of the active command is equal to or more than a preset count.

BRIEF DESCRIPTION OF THE DRAWINGS

FIG. 5 is a table for describing an operation period which is adjusted according to the input count of an active command, in accordance with an embodiment.

FIG. 15 is a table for describing the input count of a refresh command, which is adjusted according to the input count of an active command, in accordance with an embodiment.

DETAILED DESCRIPTION

Figure 1:
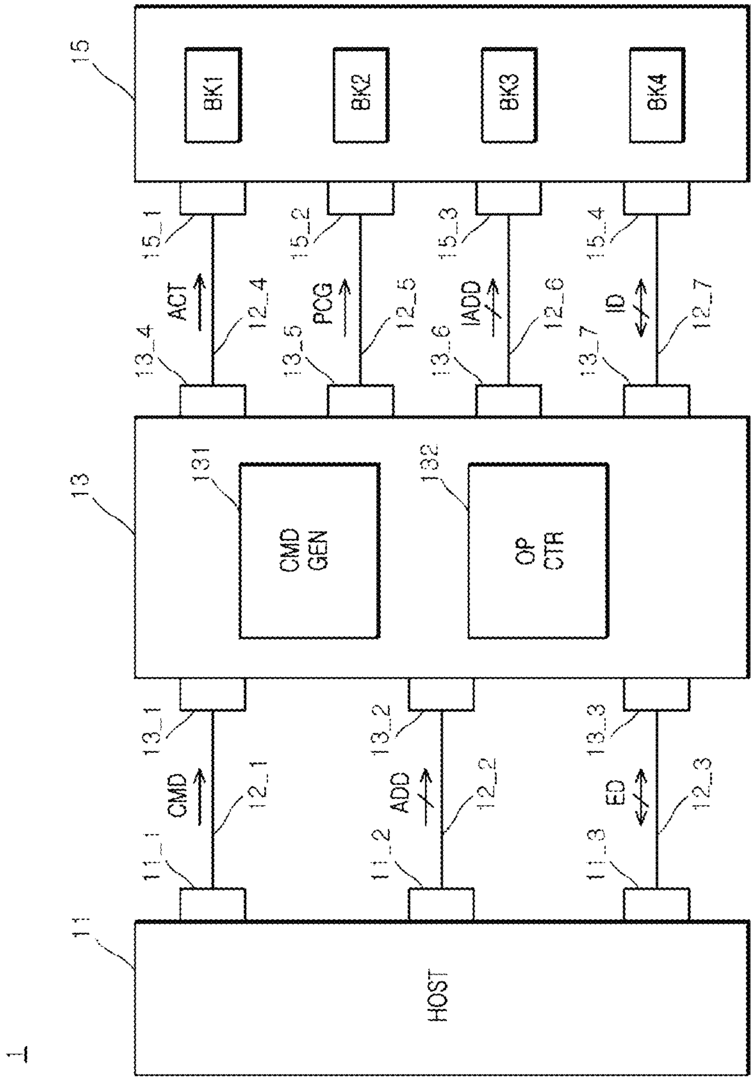
FIG. 1 is a block diagram illustrating a configuration of a semiconductor system in accordance with an embodiment.

The term "preset" indicates that the value of a parameter is previously decided, when the parameter is used in a process or algorithm. According to an embodiment, the value of the parameter may be set when the process or algorithm is started or while the process or algorithm is performed.

The terms such as "first" and "second", which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level". For example, when a signal having a first voltage corresponds to "logic high level", a signal having a second voltage may correspond to "logic low level". According to an embodiment, "logic high level" may be set to a voltage higher than "logic low level". According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, examples of embodiments will be described. The embodiments are only used to exemplify the present disclosure, and the scope of the present disclosure is not limited by the embodiments.

Some embodiments of the present disclosure are directed to a semiconductor system which can reduce the input count of an active command when the input count of the active command is equal to or more than a preset count, thereby reducing interference between adjacent word lines.

Also, some embodiments of the present disclosure are directed to a semiconductor system which can increase the input period of a refresh command when the input count of an active command is equal to or more than a preset count, thereby reducing interference between adjacent word lines.

In accordance with some embodiments, when the input count of the active command is equal to or more than the preset count, the semiconductor system may reduce the input count of the active command, thereby reducing the interference between adjacent word lines.

Furthermore, in some embodiments, the memory system may adjust the input count of the active command depending on the input count of the active command, thereby preventing data loss.

Furthermore, in some embodiments, when the input count of the active command is equal to or more than the preset count, the memory system may increase the input period of the refresh command, thereby reducing the interference between adjacent word lines.

Furthermore, in some embodiments, the memory system may adjust the input period of the refresh command according to the input count of the active command, thereby preventing data loss.

As illustrated in FIG. 1, a semiconductor system 1 in accordance with an embodiment may include a host 11, a controller 13 and a semiconductor device 15.

The host 11 may include a first host pin 11_1, a second host pin 11_2 and a third host pin 11_3. The controller 13 may include a first control pin 13_1, a second control pin 13_2, a third control pin 13_3, a fourth control pin 13_4, a fifth control pin 13_5, a sixth control pin 13_6 and a seventh control pin 13_7. The semiconductor device 15 may include a first device pin 15_1, a second device pin 15_2, a third device pin 15_3 and a fourth device pin 15_4.

The host 11 may transmit a command CMD to the controller 13 through a first transmission line 12_1 coupled between the first host pin 11_1 and the first control pin 13_1. The first host pin 11_1, the first transmission line 12_1 and the first control pin 13_1 may be each implemented as a plurality of pins or lines according to the number of bits contained in the command CMD. The host 11 may transmit an address ADD to the controller 13 through a second transmission line 12_2 coupled between the second host pin 11_2 and the second control pin 13_2. The second host pin 11_2, the second transmission line 12_2 and the second control pin 13_2 may be each implemented as a plurality of pins or lines according to the number of bits contained in the address ADD. The host 11 may output external data ED to the controller 13 or receive the external data ED from the controller 13, through a third transmission line 12_3 coupled between the third host pin 11_3 and the third control pin 13_3. The third host pin 11_3, the third transmission line 12_3 and the third control pin 13_3 may be each implemented as a plurality of pins or lines according to the number of bits contained in the external data ED.

The controller 13 may transmit an active command ACT to the semiconductor device 15 through a fourth transmission line 12_4 coupled between the fourth control pin 13_4 and the first device pin 15_1. The controller 13 may transmit a precharge command PCG to the semiconductor device 15 through a fifth transmission line 12_5 coupled between the fifth control pin 13_5 and the second device pin 15_2. The controller 13 may transmit an internal address IADD to the semiconductor device 15 through a sixth transmission line 12_6 coupled between the sixth control pin 13_6 and the third device pin 15_3. The sixth control pin 13_6, the sixth transmission line 12_6 and the third device pin 15_3 may be each implemented as a plurality of pins or lines according to the number of bits contained in the internal address IADD. The controller 13 may output internal data ID to the semiconductor device 15 or receive the internal data ID from the semiconductor device 15, through a seventh transmission line 12_7 coupled between the seventh control pin 13_7 and the fourth device pin 15_4. The seventh control pin 13_7, the seventh transmission line 12_7 and the fourth device pin 15_4 may be each implemented as a plurality of pins or lines according to the number of bits contained in the internal data ID.

The controller 13 may include a command generation circuit 131 and an operation period adjusting circuit 132.

The command generation circuit 131 may generate the active command ACT and the precharge command PCG on the basis of the command CMD. The command generation circuit 131 may control an operation period corresponding to a time period from the point of time that the active command ACT is generated to the point of time that the precharge command PCG is generated, based on operation information (OP<1:M> of FIG. 2) generated by the operation period adjusting circuit 132. The command generation circuit 131 may adjust the input count of the active command ACT applied to the semiconductor device 15 on the basis of the controlled operation period, during a preset period.

The operation period adjusting circuit 132 may detect the input count of the active command ACT during a test mode period. The operation period adjusting circuit 132 may generate the operation information OP<1:M> for controlling the operation period, when the input count of the active command ACT during the test mode period is equal to or more than a preset count.

The semiconductor device 15 may include first to fourth banks BK1 to BK4. The semiconductor device 15 may receive the active command ACT, and perform an active operation on at least one bank of the first to fourth banks BK1 to BK4 which are activated by the internal address IADD. The semiconductor device 15 may receive the precharge command PCG, and perform a precharge operation on the bank of the first to fourth banks BK1 to BK4, on which the active operation has been performed. The semiconductor device 15 may input/output the internal data ID through at least one bank of the first to fourth banks BK1 to BK4 which are activated by the internal address IADD. The semiconductor device 15 is implemented to include the first to fourth banks BK1 to BK4. In an embodiment, however, the semiconductor device 15 may be implemented to include various numbers of banks.

Figure 2:
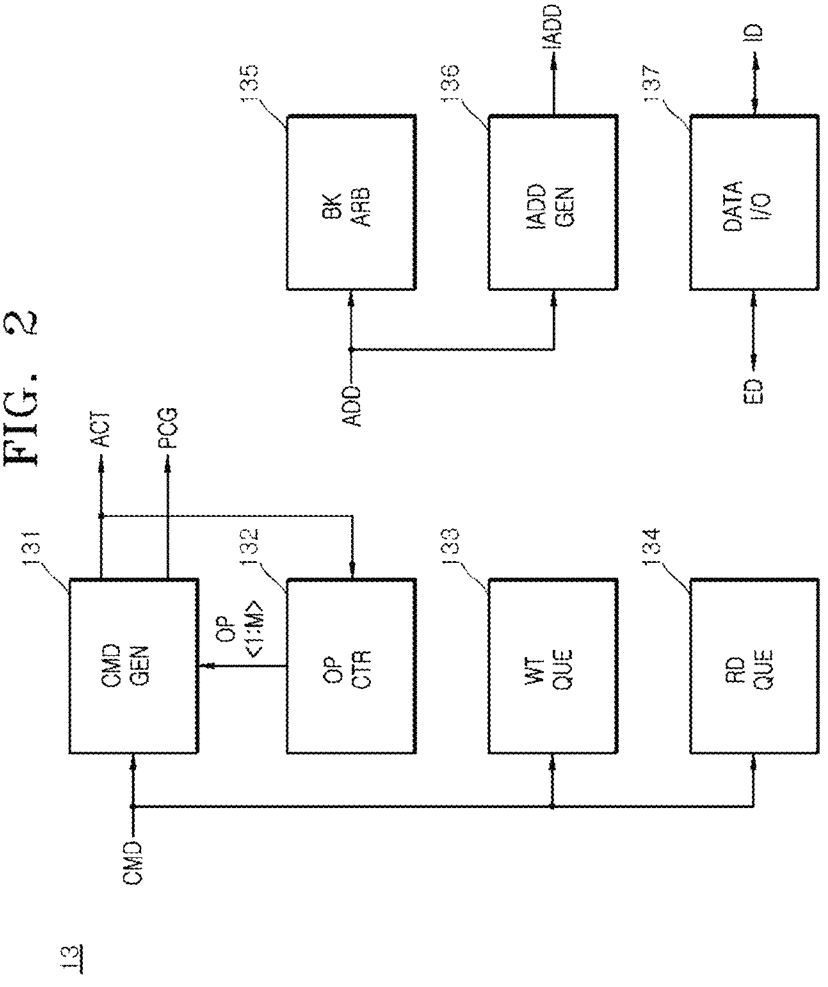
FIG. 2 is a block diagram illustrating a configuration based on an example of a controller included in the semiconductor system illustrated in FIG. 1.

FIG. 2 is a block diagram illustrating a configuration based on an example of the controller 13 included in the semiconductor system 1 illustrated in FIG. 1. The controller 13 may include the command generation circuit 131, the operation period adjusting circuit 132, a write control circuit 133, a read control circuit 134, a bank detection circuit 135, an internal address generation circuit 136 and a data input/output circuit 137.

The command generation circuit 131 may generate the active command ACT and the precharge command PCG on the basis of the command CMD. The command generation circuit 131 may control the points of time that the active command ACT and the precharge command PCG are generated, based on first to $M^{th}$ operation information OP<1:M>. The command generation circuit 131 may control the points of time that the active command ACT and the precharge command PCG are generated, through an operation period which is controlled on the basis of the first to $M^{th}$ operation information OP<1:M>. The command generation circuit 131 may adjust the input count of the active command ACT applied to the semiconductor device 15 during the preset period, through the operation period which is controlled on the basis of the first to $M^{th}$ operation information OP<1:M>. The operation period may be set to a time period tRAS from the point of time that the active command ACT is generated to the point of time that the precharge command PCG is generated. As the operation period increases, the time period tRAS from the point of time that the active command ACT is generated to the point of time that the precharge command PCG is generated may increase. For example, the command generation circuit 131 might not control the operation period, but generate the active command ACT and the precharge command PCG, when the first operation information OP<1> is generated. The command generation circuit 131 may lengthen the operation period when the second operation information OP<2> is generated, thereby lengthening the time period from the point of time that the active command ACT is generated to the point of time that the precharge command PCG is generated. The command generation circuit 131 may lengthen the time period from the point of time that the active command ACT is generated to the point of time that the precharge command PCG is generated, when the third operation information OP<3> is generated. In this case, the time period may be lengthened more than when the second operation information OP<2> is generated. The command generation circuit 131 may adjust the input count of the active command ACT applied to the semiconductor device 15 during the preset period, through the controlled operation period. For example, since the time period tRAS from the point of time that the active command ACT is generated to the point of time that the precharge command PCG is generated is increased as the operation period is lengthened, the input count of the active command ACT during the preset period equal to the time period tRAS may be reduced. The preset period may be set to a period for performing a refresh operation. The command generation circuit 131 is implemented to generate the active command ACT and the precharge command PCG. In an embodiment, however, the command generation circuit 131 may be implemented as a scheduler which decides the priorities of a write operation and a read operation through the write control circuit 133 and the read control circuit 134, and generates a command for performing the write operation and the read operation.

The operation period adjusting circuit 132 may detect the input count of the active command ACT during the test mode period. The operation period adjusting circuit 132 may generate the first to $M^{th}$ operation information OP<1:M> for controlling the operation period, when the input count of the active command ACT during the test mode period is equal to or more than a preset count.

The write control circuit 133 may detect a write operation of the semiconductor device 15 on the basis of the command CMD. The write control circuit 133 may detect the write operation of the semiconductor device 15 when the command CMD has a logic level combination for performing the write operation. The write control circuit 133 may be implemented as a general write queuing circuit.

The read control circuit 134 may detect a read operation of the semiconductor device 15 on the basis of the command CMD. The read control circuit 134 may detect the read operation of the semiconductor device 15 when the command CMD has a logic level combination for performing the read operation. The read control circuit 134 may be implemented as a general read queuing circuit.

The bank detection circuit 135 may monitor the states of the first to fourth banks BK1 to BK4 on which a write operation or read operation is performed. The bank detection circuit 135 may monitor a bank on which a write operation or read operation is performed, among the first to fourth banks BK1 to BK4, on the basis of the address ADD. The bank detection circuit 135 may monitor whether a command for performing a write operation or read operation can be input to a bank on which the write operation or read operation is not performed, among the first to fourth banks BK1 to BK4. The bank detection circuit 135 may be implemented as a bank arbiter which detects the operation states of the first to fourth banks BK1 to BK4, and monitors whether an additional command can be input according to the detection result.

The internal address generation circuit 136 may generate the internal address IADD based on the address ADD. The internal address generation circuit 136 may generate the internal address IADD by decoding the address ADD. The address ADD and the internal address IADD may each include a plurality of bits. The address ADD and the internal address IADD may each include bits for activating the first to fourth banks BK1 to BK4 and bits for activating a plurality of word lines (WL1 to WLn of FIG. 8) included in the first to fourth banks BK1 to BK4.

The data input/output circuit 137 may receive the external data ED input from the host 11 and generate the internal data ID, during a write operation. The data input/output circuit 137 may output the internal data ID to the semiconductor device 15 during the write operation. The data input/output circuit 137 may receive the internal data ID input from the semiconductor device 15 and generate the external data ED, during a read operation. The data input/output circuit 137 may output the external data ED to the host 11 during the read operation. The data input/output circuit 137 may be implemented as a general buffer circuit for inputting/outputting data between the host 11 and the semiconductor device 15, during the write/read operation.

Figure 3:
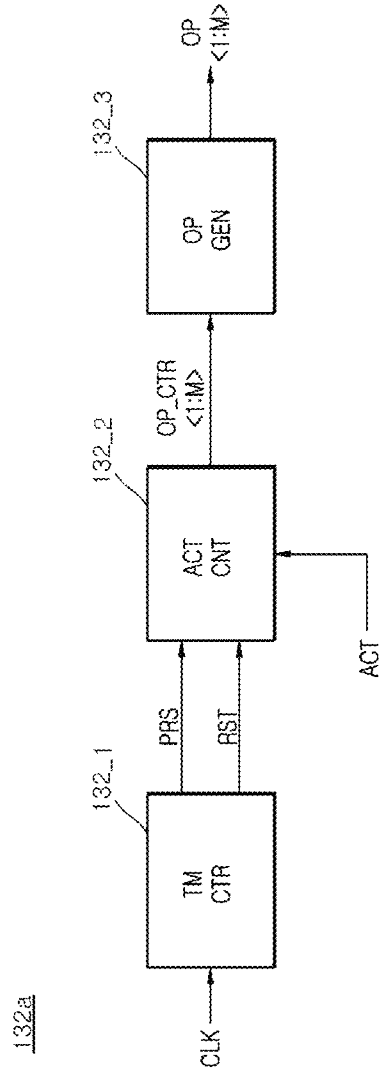
FIG. 3 is a block diagram illustrating a configuration based on an example of an operation period adjusting circuit included in the controller illustrated in FIG. 2.

FIG. 3 is a block diagram illustrating a configuration of an operation period adjusting circuit 132*a* based on an example of the operation period adjusting circuit 132 included in the controller 13 illustrated in FIG. 2. The operation period adjusting circuit 132*a* may include a test control circuit 132_1, an active counting circuit 132_2 and an operation information generation circuit 132_3.

The test control circuit 132_1 may generate a period signal PRS and a reset signal RST on the basis of pulses of a clock CLK. The test control circuit 132_1 may generate the period signal PRS which is generated whenever the number of input pulses of the clock CLK corresponds to the number of input pulses in the test mode period. The test control circuit 132_1 may generate a first pulse of the period signal PRS when the number of input pulses of the clock CLK corresponds to the number of input pulses in the test mode period, and then generate a second pulse of the period signal PRS when the number of input pulses of the clock CLK after the first pulse is generated corresponds to the number of input pulses in the test mode period. The test control circuit 132_1 may generate the reset signal RST including a pulse which is generated when the period signal PRS is generated. The test mode period may be set to periods in which various numbers of clock pulses are input depending on embodiments. For example, the test mode period may be set as a constant time period in which a clock pulses are input 10 times.

The active counting circuit 132_2 may generate first to $M^{th}$ operation control signals OP_CTR<1:M> by counting the number of times that the active command ACT is input, on the basis of the pulses of the period signal PRS. The active counting circuit 132_2 may count the number of times that the active command ACT is input, from the point of time that the first pulse of the period signal PRS is input to the point of time that the second pulse of the period signal PRS is input. The active counting circuit 132_2 may generate the first to $M^{th}$ operation control signals OP_CTR<1:M>, when the input count of the active command ACT becomes equal to or more than a preset count. The active counting circuit 132_2 may reset the input count of the active command ACT when a pulse of the reset signal RST is input. The first to $M^{th}$ operation control signals OP_CTR<1:M> may be configured to have various number of bits depending on embodiments. The first to $M^{th}$ operation control signals OP_CTR<1:M> may include input count period information of the active command ACT. The first to $M^{th}$ operation control signals OP_CTR<1:M> including the input count period information of the active command ACT will be described with reference to FIG. 5.

The operation information generation circuit 132_3 may generate the first to $M^{th}$ operation information OP<1:M> on the basis of the first to $M^{th}$ operation control signals OP_CTR<1:M>. The operation information generation circuit 132_3 may output the first to $M^{th}$ operation control signals OP_CTR<1:M> as the first to $M^{th}$ operation information OP<1:M>. The number of bits contained in the first to $M^{th}$ operation information OP<1:M> for adjusting the input count of the active command ACT may be set to various values depending on embodiments.

Figure 4:
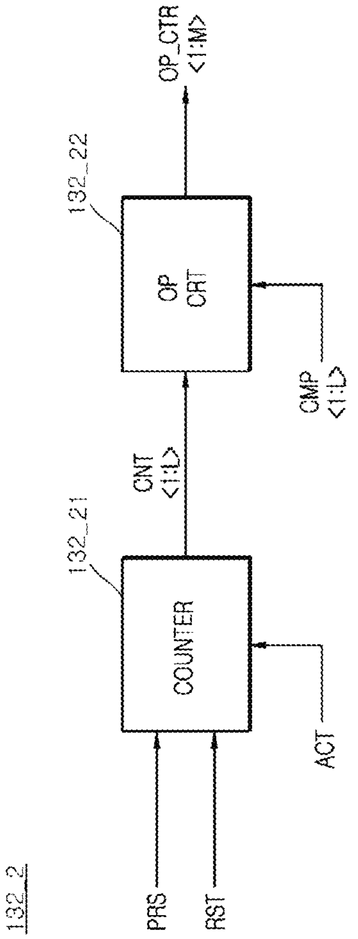
FIG. 4 is a block diagram illustrating a configuration based on an example of an active counting circuit included in the operation period adjusting circuit illustrated in FIG. 3.

FIG. 4 is a block diagram illustrating a configuration based on an example of the active counting circuit 132_2 included in the operation period adjusting circuit 132*a* illustrated in FIG. 3. The active counting circuit 132_2 may include a counter 132_21 and a comparison circuit 132_22.

The counter 132_21 may generate first to $L^{th}$ counting signals CNT<1:L> which are counted according to the input count of the active command ACT based on the pulses of the period signal PRS. The counter 132_21 may generate the first to $L^{th}$ counting signals CNT<1:L> which are sequentially counted whenever the active command ACT is input, from the point of time that the first pulse of the period signal PRS is input to the point of time that the second pulse of the period signal PRS is input. The counter 132_21 may store the first to $L^{th}$ counting signals CNT<1:L>. The counter 132_21 may reset the first to $L^{th}$ counting signals CNT<1:L> on the basis of the pulses of the reset signal RST. The counter 132_21 may reset the first to $L^{th}$ counting signals CNT<1:L> whenever the pulse of the reset signal RST is input.

The comparison circuit 132_22 may generate the first to $M^{th}$ operation control signals OP_CTR<1:M> by comparing the first to $L^{th}$ counting signals CNT<1:L> to first to $L^{th}$ comparison signals CMP<1:L>. The first to $L^{th}$ comparison signals CMP<1:L> may be set to a signal which includes information when the input count of the active command ACT corresponds to the preset count.

FIG. 5 is a table for describing the operation period tRAS which is controlled according to the input count of the active command ACT.

When the input count of the active command ACT corresponds to 30% of a preset count Max, the operation period tRAS is not adjusted. At this time, the input count of the active command ACT applied to the semiconductor device 15 may be adjusted to 1,200 k. At this time, when the input count of the active command ACT corresponds to 30% of the preset count Max, the active counting circuit 132_2 may generate the first operation control signal OP_CTR<1>.

When the input count of the active command ACT corresponds to 50% of the preset count Max, the operation period tRAS is adjusted to (tRAS+10 n). The "n" is a nanosecond, and the "n" means one billionth of a second. In other words, when the input count of the active command ACT corresponds to 50% of the preset count Max, the operation period tRAS may be lengthened by 10 n. At this time, the input count of the active command ACT applied to the semiconductor device 15 may be adjusted to 1,000 k. The "k" is kilo, and "k" means $10^3$. When the input count of the active command ACT corresponds to 50% of the preset count Max, the active counting circuit 132_2 may generate the second operation control signal OP_CTR<2>.

When the input count of the active command ACT corresponds to 70% of the preset count Max, the operation period tRAS may be adjusted to (tRAS+20 n). When the input count of the active command ACT corresponds to 70% of the preset count Max, the operation period tRAS may be lengthened by 20 n. At this time, the input count of the active command ACT applied to the semiconductor device 15 may be adjusted to 857 k. When the input count of the active command ACT corresponds to 70% of the preset count Max, the active counting circuit 132_2 may generate the third operation control signal OP_CTR<3>.

When the input count of the active command ACT corresponds to 90% of the preset count Max, the operation period tRAS is controlled to (tRAS+30 n). When the input count of the active command ACT corresponds to 90% of the preset count Max, the operation period tRAS may be lengthened by 30 n. At this time, the input count of the active command ACT applied to the semiconductor device 15 may be adjusted to 750 k. When the input count of the active command ACT corresponds to 90% of the preset count Max, the active counting circuit 132_2 may generate the fourth operation control signal OP_CTR<4>.

When the input count of the active command ACT corresponds to the preset count Max, the operation period tRAS is controlled to (tRAS+40 n). When the input count of the active command ACT corresponds to the preset count Max, the operation period tRAS may be lengthened by 40 n. At this time, the input count of the active command ACT applied to the semiconductor device 15 may be adjusted to 667 k. When the input count of the active command ACT corresponds to the preset count Max, the active counting circuit 132_2 may generate the fifth operation control signal OP_CTR<5>.

Figure 6:
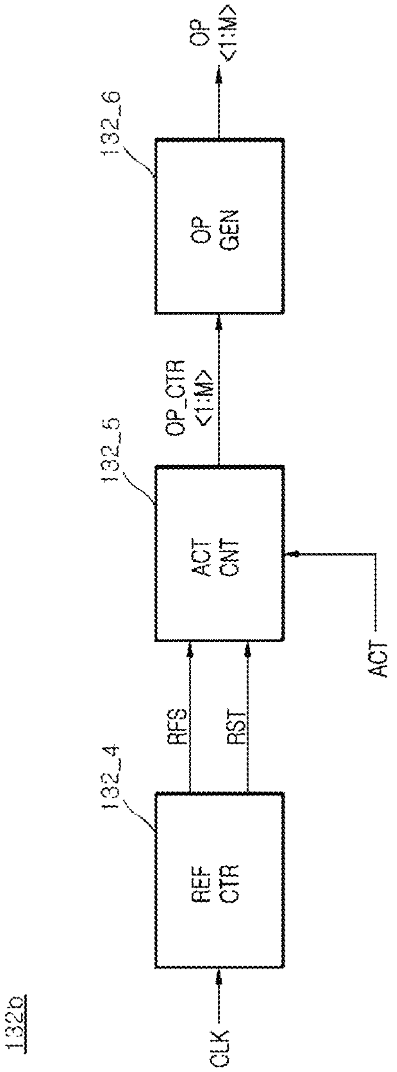
FIG. 6 is a block diagram illustrating a configuration based on another example of the operation period adjusting circuit included in the controller illustrated in FIG. 2.

FIG. 6 is a block diagram illustrating a configuration of an operation period adjusting circuit 132*b* based on another example of the operation period adjusting circuit 132 included in the controller 13 illustrated in FIG. 2. The operation period adjusting circuit 132*b* may include a refresh control circuit 132_4, an active counting circuit 132_5 and an operation information generation circuit 132_6.

The refresh control circuit 132_4 may generate a refresh period signal RFS and the reset signal RST on the basis of pulses of the clock CLK. The refresh control circuit 132_4 may generate the refresh period signal RFS whenever the number of input pulses of the clock CLK corresponds to the number of input pulses in a refresh period. The refresh control circuit 132_4 may generate a first pulse of the refresh period signal RFS when the number of input pulses of the clock CLK corresponds to the number of input pulses in the refresh period, and then generate a second pulse of the refresh period signal RFS when the number of input pulses of the clock CLK after the first pulse is generated corresponds to the number of input pulses in the refresh period. The refresh control circuit 132_4 may generate the reset signal RST including a pulse which is generated when the refresh period signal RFS is generated.

The active counting circuit 132_5 may generate the first to $M^{th}$ operation control signals OP_CTR<1:M> by counting the number of times that the active command ACT is input, on the basis of the pulses of the refresh period signal RFS. The active counting circuit 132_5 may count the number of times that the active command ACT is input, from the point of time that the first pulse of the refresh period signal RFS is input to the point of time that the second pulse of the refresh period signal RFS is input. The active counting circuit 132_5 may generate the first to $M^{th}$ operation control signals OP_CTR<1:M>, when the input count of the active command ACT is equal to or more than the preset count. The active counting circuit 132_5 may reset the input count of the active command ACT when a pulse of the reset signal RST is input.

The operation information generation circuit 132_6 may generate the first to $M^{th}$ operation information OP<1:M> on the basis of the first to $M^{th}$ operation control signals OP_CTR<1:M>. The operation information generation circuit 132_6 may output the first to $M^{th}$ operation control signals OP_CTR<1:M> as the first to $M^{th}$ operation information OP<1:M>. The number of bits contained in the first to $M^{th}$ operation information OP<1:M> for adjusting the input count of the active command ACT may be set to various values depending on embodiments.

Figure 7:
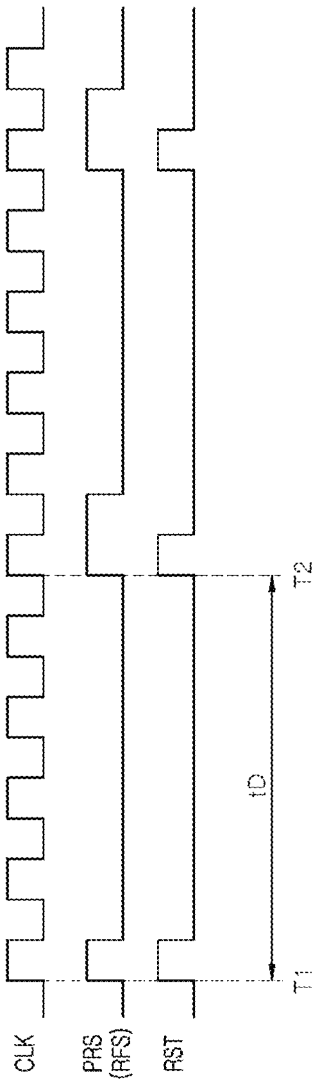
FIG. 7 is a timing diagram for describing an operation of the operation period adjusting circuit illustrated in FIG. 2.

FIG. 7 is a timing diagram for describing the operation of the operation period adjusting circuit 132*a* in accordance with the embodiment.

The test control circuit 132_1 generates the first pulse of the period signal PRS and the reset signal RST on the basis of a pulse of the clock CLK at time T1, and then generates the second pulse of the period signal PRS and the reset signal RST on the basis of a pulse of the clock CLK at time T2. The time period from the point of time (time T1) that the first pulse of the period signal PRS is generated to the point of time (time T2) that the second pulse of the period signal PRS is generated is set to a text mode period tD.

The active counting circuit 132_2 resets the first to $L^{th}$ counting signals CNT<1:L> indicating the input count of the active command ACT, when a pulse of the reset signal RST is input. The active counting circuit 132_2 generates the first to $L^{th}$ counting signals CNT<1:L> by counting the number of times that the active command ACT is input, during the time period from the point of time (time T1) that the first pulse of the period signal PRS is input to the point of time (time T2) that the second pulse of the period signal PRS is input. The active counting circuit 132_2 generates the first to $M^{th}$ operation control signals OP_CTR<1:M> by comparing the first to $L^{th}$ counting signals CNT<1:L> to the first to $L^{th}$ comparison signals CMP<1:L>. The active counting circuit 132_2 generates the first to $M^{th}$ operation control signals OP_CTR<1:M> when the first to $L^{th}$ counting signals CNT<1:L> and the first to $L^{th}$ comparison signals CMP<1:L> have the same combination.

The operation information generation circuit 132_3 generates the first to $M^{th}$ operation information OP<1:M> on the basis of the first to $M^{th}$ operation control signals OP_CTR<1:M>. The operation information generation circuit 132_3 outputs the first to $M^{th}$ operation control signals OP_CTR<1:M> as the first to $M^{th}$ operation information OP<1:M>.

The command generation circuit 131 lengthens the operation period tRAS on the basis of the first to $M^{th}$ operation information OP<1:M>, thereby lengthening the time period from the point of time that the active command ACT is generated to the point of time that the precharge command PCG is generated. Since the time period tRAS from the point of time that the active command ACT is generated to the point of time that the precharge command PCG is generated is lengthened, the input count of the active command ACT during the preset period equal to the time period tRAS may be reduced.

Since the operation period adjusting circuit 132*b* illustrated in FIG. 6 only generates the refresh period signal RFS instead of the period signal PRS and performs the same operation as the operation of the operation period adjusting circuit 132*a* illustrated in FIG. 7, the detailed descriptions thereof will be omitted.

Figure 8:
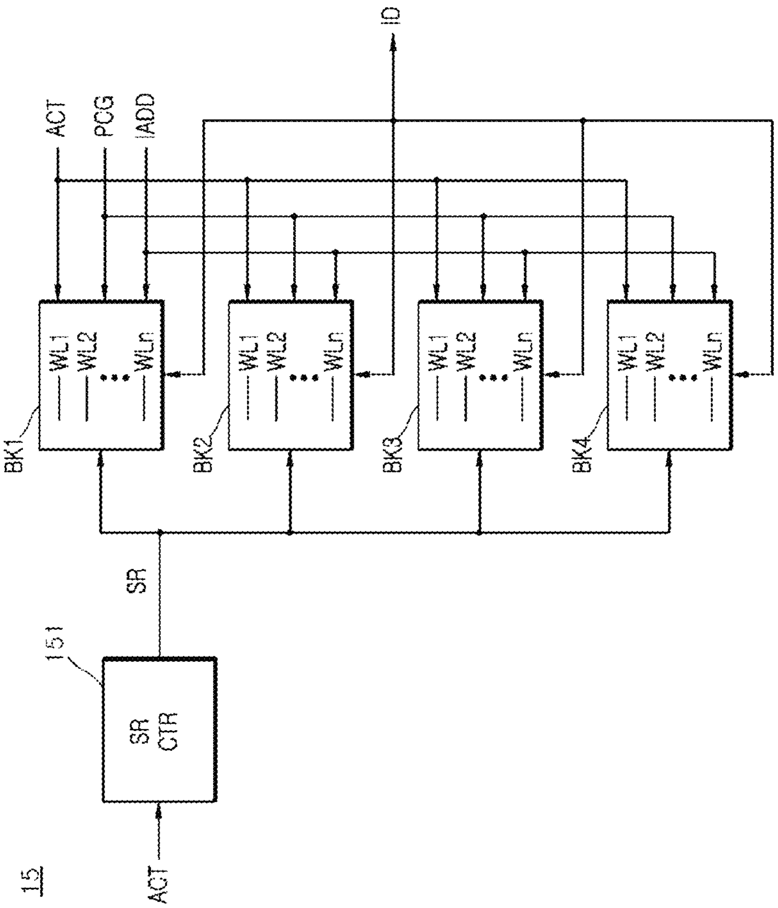
FIG. 8 is a block diagram illustrating a configuration based on an example of a semiconductor device included in the semiconductor system illustrated in FIG. 1.

FIG. 8 is a block diagram illustrating a configuration based on another embodiment of the semiconductor device 15 included in the semiconductor system 1 illustrated in FIG. 1. The semiconductor device 15 may include a smart refresh control circuit 151, a first bank BK1, a second bank BK2, a third bank BK3 and a fourth bank BK4.

The smart refresh control circuit 151 may generate a smart refresh signal SR for performing a smart refresh operation according to the input count of the active command ACT. The smart refresh control circuit 151 may generate the smart refresh signal SR having a generation period that is adjusted according to the input count of the active command ACT. The smart refresh control circuit 151 may shorten the period of the smart refresh signal SR for performing the smart refresh operation, when the input count of the active command ACT is equal to or more than the preset count.

The first bank BK1 may include a plurality of word lines WL1 to WLn. The first bank BK1 may receive the active command ACT, and perform an active operation on a word line which is activated by the internal address IADD, among the plurality of word lines WL1 to WLn. The first bank BK1 may receive the precharge command PCG, and perform a precharge operation on a word line which is activated by the internal address IADD, among the plurality of word lines WL1 to WLn. The first bank BK1 may receive the smart refresh signal SR, and perform a smart refresh operation to additionally activate word lines adjacent to the word line which is activated by the internal address IADD, among the plurality of word lines WL1 to WLn. For example, the first bank BK1 may receive the smart refresh signal SR, and perform the smart refresh operation to additionally activate first and third word lines WL1 and WL3, when a second word line WL2 is activated by the internal address IADD. During a write operation, the first bank BK1 may store internal data ID in the word line which is activated by the internal address IADD, among the plurality of word lines WL1 to WLn. During a read operation, the first bank BK1 may output the internal data ID stored in the word line which is activated by the internal address IADD, among the plurality of word lines WL1 to WLn.

Since the second to fourth banks BK2 to BK4 are implemented to have the same structure as the first bank BK1 and perform the same operation as the first bank BK1, the detailed descriptions thereof will be omitted herein.

Figure 9:
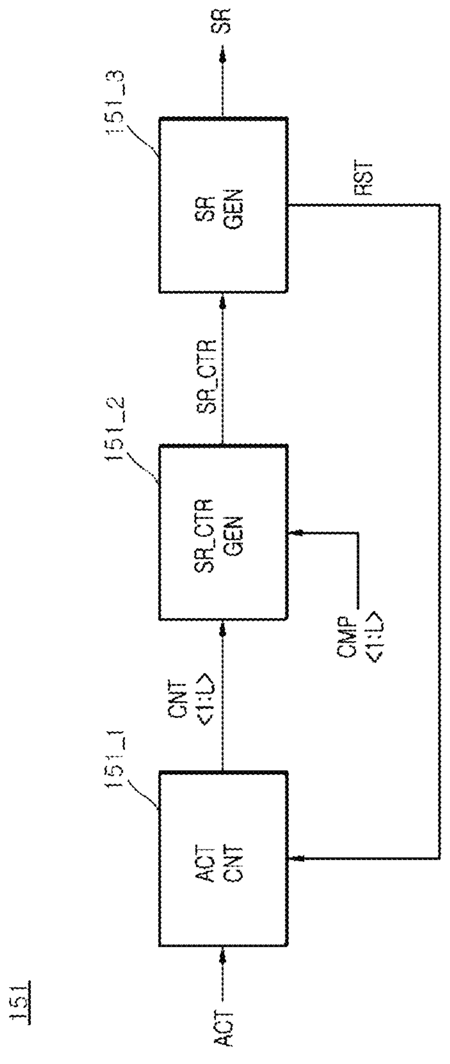
FIG. 9 is a block diagram illustrating a configuration based on an example of a smart refresh control circuit included in the semiconductor device illustrated in FIG. 8.

FIG. 9 is a block diagram illustrating a configuration based on an embodiment of the smart refresh control circuit 151 included in the semiconductor device 15 illustrated in FIG. 8. The smart refresh control circuit 151 may include an active counter 151_1, a smart refresh control signal generation circuit 151_2 and a smart refresh signal generation circuit 151_3.

The active counter 151_1 may generate the first to $L^{th}$ counting signals CNT<1:L> which are counted according to the input count of the active command ACT. The active counter 151_1 may generate the first to $L^{th}$ counting signals CNT<1:L> which are sequentially counted whenever the active command ACT is input. In an embodiment, the active counter 151_1 may generate the first to $L^{th}$ counting signals CNT<1:L> which are sequentially counted whenever the active command ACT is input during a test mode period. The active counter 151_1 may store the first to $L^{th}$ counting signals CNT<1:L>. The active counter 151_1 may reset the first to $L^{th}$ counting signals CNT<1:L> on the basis of a pulse of the reset signal RST. In an embodiment, the active counter 151_1 may reset the first to $L^{th}$ counting signals CNT<1:L> after the test mode period. The active counter 151_1 may reset the first to $L^{th}$ counting signals CNT<1:L> whenever the pulse of the reset signal RST is input.

The smart refresh control signal generation circuit 151_2 may generate a smart refresh control signal SR_CTR by comparing the first to $L^{th}$ counting signals CNT<1:L> to the first to $L^{th}$ comparison signals CMP<1:L>. The smart refresh control signal generation circuit 151_2 may generate the smart refresh control signal SR_CTR when the first to $L^{th}$ counting signals CNT<1:L> and the first to $L^{th}$ comparison signals CMP<1:L> have the same combination. The first to $L^{th}$ comparison signals CMP<1:L> may be set to a signal including information in the case that the input count of the active command ACT is equal to the preset count. The smart refresh control signal generation circuit 151_2 is implemented to generate one smart refresh control signal SR_CTR. However, the smart refresh control signal generation circuit 151_2 may be implemented to generate the smart refresh control signal SR_CTR including a plurality of bits.

The smart refresh signal generation circuit 151_3 may adjust the generation period of the smart refresh signal SR on the basis of the smart refresh control signal SR_CTR. The smart refresh signal generation circuit 151_3 may generate the smart refresh signal SR having a generation period that is shortened, when the smart refresh control signal SR_CTR is input. The smart refresh signal generation circuit 151_3 may generate the smart refresh signal SR having the same generation period, when the smart refresh control signal SR_CTR is not input. The smart refresh signal generation circuit 151_3 may generate the reset signal RST including a pulse which is generated when the smart refresh signal SR is generated.

Figure 10:
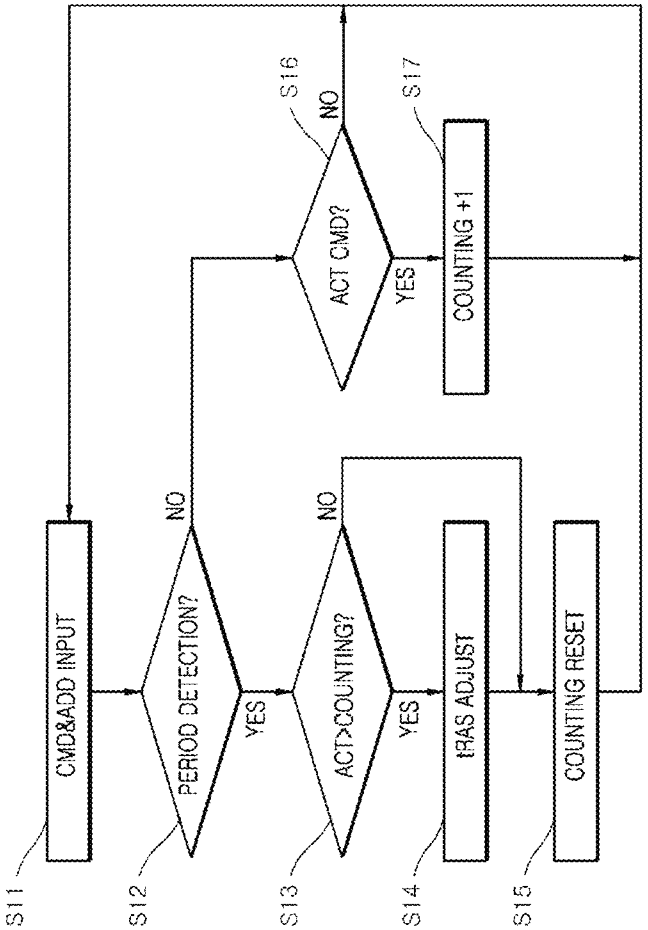
FIGS. 10 and 11 are flowcharts for describing an active period control operation of the semiconductor system in accordance with the embodiment.
Figure 11:
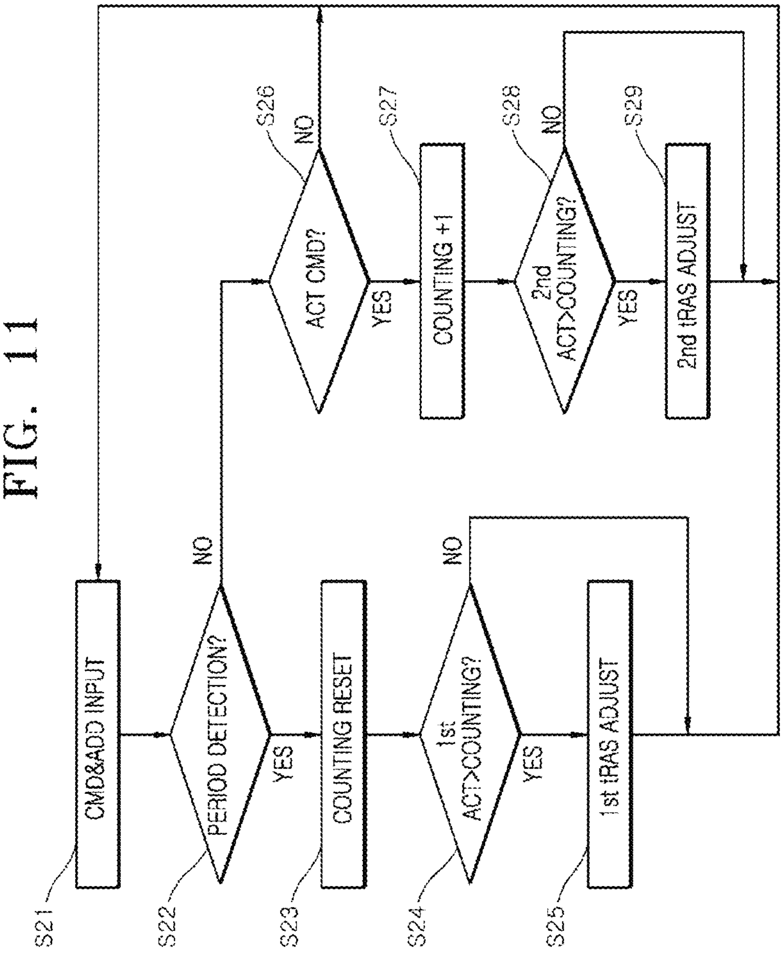

FIGS. 10 and 11 are flowcharts for describing an active period control method in accordance with an embodiment.

Referring to FIG. 10, the active period control method in accordance with the present embodiment will be described as follows.

The active period control method may include a command address input step S11, a period detection step S12, a comparison step S13, an operation period adjusting step S14, a reset step S15, an active detection step S16 and a counting step S17.

The command address input step S11 may be set to a step in which the host 11 applies the command CMD and the address ADD to the controller 13.

The period detection step S12 may be set to a step in which the test control circuit 132_1 detects a pulse of the period signal PRS, which is generated on the basis of a pulse of the clock CLK. When the pulse of the period signal PRS is generated in the period detection step S12 (YES), the procedure may proceed to the comparison step S13. When the pulse of the period signal PRS is not generated in the period detection step S12 (NO), the procedure may proceed to the active detection step S16.

The comparison step S13 may be set to a step of detecting the number of times that the active command ACT generated from the command CMD is input during the test mode period. When the input count of the active command ACT is equal to or more than the preset count in the comparison step S13 (YES), the procedure may proceed to the operation period adjusting step S14. In the comparison step S13, the active counting circuit 132_2 may count the number of times that the active command ACT is input, from the point of time that the first pulse of the period signal PRS is input to the point of time that the second pulse of the period signal PRS is input. When the input count of the active command ACT is equal to or more than the preset count, the active counting circuit 132_2 may generate the first to $M^{th}$ operation control signals OP_CTR<1:M>. When the input count of the active command ACT is less than the preset count in the comparison step S13 (NO), the procedure may proceed to the reset step S15.

The operation period adjusting step S14 may be set to a step of adjusting the time period tRAS from the point of time that the active command ACT is generated to the point of time that the precharge command PCG is generated, when the input count of the active command ACT is equal to or more than the preset count (YES). In the operation period adjusting step S14, the operation information generation circuit 132_3 may generate the first to $M^{th}$ operation information OP<1:M> on the basis of the first to $M^{th}$ operation control signals OP_CTR<1:M>. In the operation period adjusting step S14, the command generation circuit 131 may increase the time period from the point of time that the active command ACT is generated to the point of time that the precharge command PCG is generated, based on the first to $M^{th}$ operation information OP<1:M>.

The reset step S15 may be set to a step of resetting the input count of the active command ACT. In the reset step S15, the test control circuit 132_1 may generate the reset signal RST including a pulse which is generated when the period signal PRS is generated. In the reset step S15, the active counting circuit 132_2 may reset the input count of the active command ACT when a pulse of the reset signal RST is input. After the input count of the active command ACT is reset in the reset step S15, the procedure may return to the command address input step S11.

The active detection step S16 may be set to a step of detecting that the active command ACT is generated on the basis of the command CMD. When the active command ACT is generated in the active detection step S16 (YES), the procedure may proceed to the counting step S17. In the active detection step S16, the command generation circuit 131 may generate the active command ACT on the basis of the command CMD. When the active command ACT is not generated in the active detection step S16 (NO), the procedure may return to the command address input step S11.

The counting step S17 may be set to a step of counting the number of times that the active command ACT is input. In the counting step S17, the active counting circuit 132_2 may up-count the input count of the active command ACT by 1. After the input count of the active command ACT is up-counted by 1 in the counting step S17, the procedure may return to the command address input step S11.

The active period control method in accordance with the present embodiment may decrease the input count of the active command when the input count of the active command is equal to or more than the preset count, thereby reducing the interference between adjacent word lines. Furthermore, the active period control method in accordance with the present embodiment may adjust the input count of the active command depending on the input count of the active command, thereby preventing data loss.

Next, an active period control method in accordance with an embodiment will be described as follows with reference to FIG. 11.

The active period control method may include a command address input step S21, a period detection step S22, a reset step S23, a first comparison step S24, a first operation period adjusting step S25, an active detection step S26, a counting step S27, a second comparison step S28 and a second operation period adjusting step S29.

The command address input step S21 may be set to a step in which the host 11 applies the command CMD and the address ADD to the controller 13.

The period detection step S22 may be set to a step in which the test control circuit 132_1 detects a pulse of the period signal PRS, which is generated on the basis of a pulse of the clock CLK. When the pulse of the period signal PRS is generated in the period detection step S22 (YES), the procedure may proceed to the first reset step S23. When the pulse of the period signal PRS is not generated in the period detection step S22 (NO), the procedure may proceed to the active detection step S26.

The reset step S23 may be set to a step of resetting the input count of the active command ACT. In the reset step S23, the test control circuit 132_1 may generate the reset signal RST including a pulse which is generated when the period signal PRS is generated. In the reset step S23, the active counting circuit 132_2 may reset the input count of the active command ACT when a pulse of the reset signal RST is input. After the input count of the active command ACT is reset in the reset step S23, the procedure may proceed to the first comparison step S24.

The first comparison step S24 may be set to a step of detecting the input count of the active command ACT before the resetting of the input count in the first reset step S23. When the input count of the active command ACT before the resetting of the input count in the first reset step S23 is equal to or more than the preset count in the first comparison step S24 (YES), the procedure may proceed to the first operation period adjusting step S25. In the first comparison step S24, the active counting circuit 132_2 may generate the first to $M^{th}$ operation control signals OP_CTR<1:M>, when the input count of the active command ACT before the resetting of the input count in the first reset step S23 is equal to or more than the preset count. When the input count of the active command ACT is less than the preset count in the first comparison step S24 (NO), the procedure may return to the command address input step S21.

The first operation period adjusting step S25 may be set to a step of adjusting the time period tRAS from the point of time that the active command ACT is generated to the point of time that the precharge command PCG is generated, when the input count of the active command ACT is equal to or more than the preset count (YES). In the first operation period adjusting step S25, the operation information generation circuit 132_3 may generate the first to $M^{th}$ operation information OP<1:M> on the basis of the first to $M^{th}$ operation control signals OP_CTR<1:M>. In the first operation period adjusting step S25, the command generation circuit 131 may increase the time period from the point of time that the active command ACT is generated to the point of time that the precharge command PCG is generated, based on the first to $M^{th}$ operation information OP<1:M>. After the first operation period adjusting step S25 is ended, the procedure may return to the command address input step S21.

The active detection step S26 may be set to a step of detecting that the active command ACT is generated on the basis of the command CMD. When the active command ACT is generated in the active detection step S26 (YES), the procedure may proceed to the counting step S27. In the active detection step S26, the command generation circuit 131 may generate the active command ACT on the basis of the command CMD. When the active command ACT is not generated in the active detection step S26 (NO), the procedure may return to the command address input step S21.

The counting step S27 may be set to a step of counting the number of times that the active command ACT is input. In the counting step S27, the active counting circuit 132_2 may up-count the input count of the active command ACT by 1. After the input count of the active command ACT is up-counted by 1 in the counting step S27, the procedure may proceed to the second comparison step S28.

The second comparison step S28 may be set to a step of detecting the input count of the active command ACT in the counting step S27. When the input count of the active command ACT in the counting step S27 is equal to or more than the preset count in the second comparison step S28 (YES), the procedure may proceed to the second operation period adjusting step S29. In the second comparison step S28, the active counting circuit 132_2 may generate the first to $M^{th}$ operation control signals OP_CTR<1:M>, when the input count of the active command ACT, adjusted in the counting step S27, is equal to or more than the preset count. When the input count of the active command ACT is less than the preset count in the second comparison step S28 (NO), the procedure may return to the command address input step S21.

The second operation period adjusting step S29 may be set to a step of adjusting the time period tRAS from the point of time that the active command ACT is generated to the point of time that the precharge command PCG is generated, when the input count of the active command ACT is equal to or more than the preset count (YES). In the second operation period adjusting step S29, the operation information generation circuit 132_3 may generate the first to $M^{th}$ operation information OP<1:M> on the basis of the first to $M^{th}$ operation control signals OP_CTR<1:M>. In the second operation period adjusting step S29, the command generation circuit 131 may increase the time period from the point of time that the active command ACT is generated to the point of time that the precharge command PCG is generated, based on the first to $M^{th}$ operation information OP<1:M>. After the second operation period adjusting step S29 is ended, the procedure may return to the command address input step S21.

The active period control method in accordance with the present embodiment may decrease the input count of the active command when the input count of the active command is equal to or more than the preset count, thereby reducing the interference between adjacent word lines. Furthermore, the active period control method in accordance with the present embodiment may adjust the input count of the active command depending on the input count of the active command, thereby preventing data loss.

Figure 12:
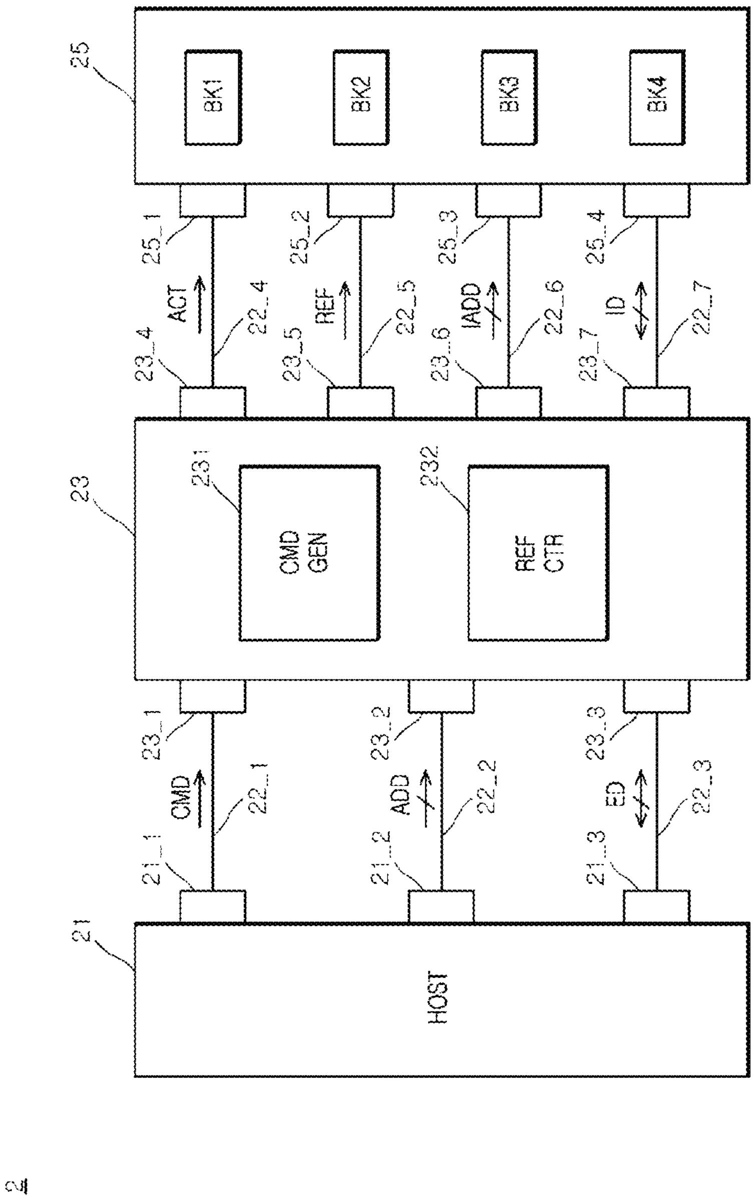
FIG. 12 is a block diagram illustrating a configuration of a semiconductor system in accordance with another embodiment.

As illustrated in FIG. 12, a semiconductor system 2 in accordance with another embodiment may include a host 21, a controller 23 and a semiconductor device 25.

The host 21 may include a first host pin 21_1, a second host pin 21_2 and a third host pin 21_3. The controller 23 may include a first control pin 23_1, a second control pin 23_2, a third control pin 23_3, a fourth control pin 23_4, a fifth control pin 23_5, a sixth control pin 23_6 and a seventh control pin 23_7. The semiconductor device 25 may include a first device pin 25_1, a second device pin 25_2, a third device pin 25_3 and a fourth device pin 25_4.

The host 21 may transmit a command CMD to the controller 23 through a first transmission line 22_1 coupled between the first host pin 21_1 and the first control pin 23_1. The first host pin 21_1, the first transmission line 22_1 and the first control pin 23_1 may be each implemented as a plurality of pins or lines according to the number of bits contained in the command CMD. The host 21 may transmit an address ADD to the controller 23 through a second transmission line 22_2 coupled between the second host pin 21_2 and the second control pin 23_2. The second host pin 21_2, the second transmission line 22_2 and the second control pin 23_2 may be each implemented as a plurality of pins or lines according to the number of bits contained in the address ADD. The host 21 may output external data ED to the controller 23 or receive the external data ED from the controller 23, through a third transmission line 22_3 coupled between the third host pin 21_3 and the third control pin 23_3. The third host pin 21_3, the third transmission line 22_3 and the third control pin 23_3 may be each implemented as a plurality of pins or lines according to the number of bits contained in the external data ED.

The controller 23 may transmit an active command ACT to the semiconductor device 25 through a fourth transmission line 22_4 coupled between the fourth control pin 23_4 and the first device pin 25_1. The controller 23 may transmit a refresh command REF to the semiconductor device 25 through a fifth transmission line 22_5 coupled between the fifth control pin 23_5 and the second device pin 25_2. The controller 23 may transmit an internal address IADD to the semiconductor device 25 through a sixth transmission line 22_6 coupled between the sixth control pin 23_6 and the third device pin 25_3. The sixth control pin 23_6, the sixth transmission line 22_6 and the third device pin 25_3 may be each implemented as a plurality of pins or lines according to the number of bits contained in the internal address IADD. The controller 23 may output internal data ID to the semiconductor device 25 or receive the internal data ID from the semiconductor device 25, through a seventh transmission line 22_7 coupled between the seventh control pin 23_7 and the fourth device pin 25_4. The seventh control pin 23_7, the seventh transmission line 22_7 and the fourth device pin 25_4 may be each implemented as a plurality of pins or lines according to the number of bits contained in the internal data ID.

The controller 23 may include a command generation circuit 231 and a refresh control circuit 232.

The command generation circuit 231 may generate the active command ACT and the refresh command REF based on the command CMD. The command generation circuit 231 may adjust the input period of the refresh command REF on the basis of refresh information (RP<1:M> of FIG. 13) generated by the refresh control circuit 232.

The refresh control circuit 232 may detect the input count of the active command ACT during a test mode period. The refresh control circuit 232 may generate the refresh information RP<1:M> for controlling a refresh period, when the input count of the active command ACT during the test mode period is equal to or more than the preset count.

The semiconductor device 25 may include first to fourth banks BK1 to BK4. The semiconductor device 25 may receive the active command ACT, and perform an active operation on at least one bank of the first to fourth banks BK1 to BK4 which are activated by the internal address IADD. The semiconductor device 25 may receive the refresh command REF, and perform a refresh operation on the first to fourth banks BK1 to BK4. The semiconductor device 25 may input/output the internal data ID through at least one bank of the first to fourth banks BK1 to BK4 which are activated by the internal address IADD. The semiconductor device 25 is implemented to include the first to fourth banks BK1 to BK4. In an embodiment, however, the semiconductor device 15 may be implemented to include various numbers of banks.

Figure 13:
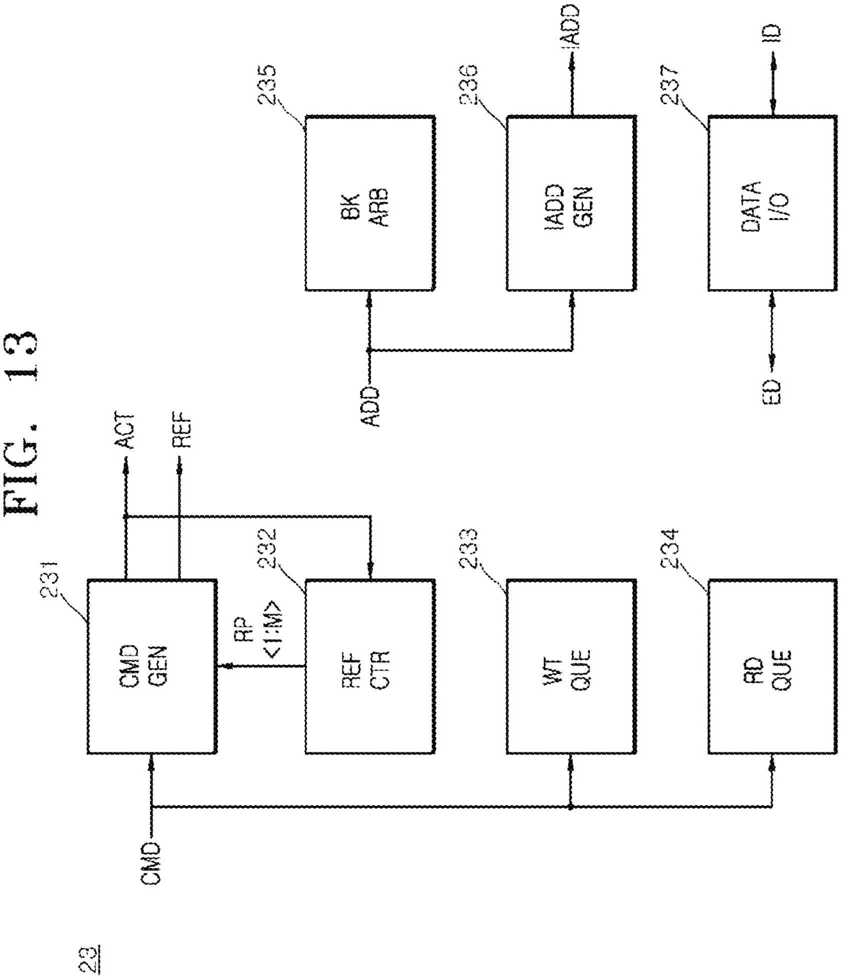
FIG. 13 is a block diagram illustrating a configuration based on an example of a controller included in the semiconductor system illustrated in FIG. 12.

FIG. 13 is a block diagram illustrating a configuration based on an example of the controller 23 included in the semiconductor system 2 illustrated in FIG. 12. The controller 23 may include the command generation circuit 231, the refresh control circuit 232, a write control circuit 233, a read control circuit 234, a bank detection circuit 235, an internal address generation circuit 236 and a data input/output circuit 237.

The command generation circuit 231 may generate the active command ACT and the refresh command REF on the basis of the command CMD. The command generation circuit 231 may adjust the input period of the refresh command REF on the basis of the first to $M^{th}$ refresh information RP<1:M>. The command generation circuit 231 may adjust the input period of the refresh command REF applied to the semiconductor device 15 on the basis of the first to $M^{th}$ refresh information RP<1:M>. For example, the command generation circuit 231 might not adjust the input period of the refresh command REF, when the first refresh information RP<1> is generated. When the second refresh information RP<2> is generated, the command generation circuit 231 may increase the input period of the refresh command REF more than when the first refresh information RP<1> is generated. When the third refresh information RP<3> is generated, the command generation circuit 231 may increase the input period of the refresh command REF more than when the second refresh information RP<2> is generated. The command generation circuit 231 is implemented to generate the active command ACT and the refresh command REF. In an embodiment, however, the command generation circuit 231 may be implemented as a scheduler which decides the priorities of a write operation and a read operation through the write control circuit 233 and the read control circuit 234, and generates a command for performing the write operation and the read operation.

The refresh control circuit 232 may detect the input count of the active command ACT during the test mode period. The refresh control circuit 232 may generate the first to $M^{th}$ refresh information RP<1:M> for adjusting the input period of the refresh command REF, when the input count of the active command ACT during the test mode period is equal to or more than a preset count.

Since the write control circuit 233, the read control circuit 234, the bank detection circuit 235, the internal address generation circuit 236 and the data input/output circuit 237 are implemented and operated in the same manner as the write control circuit 133, the read control circuit 134, the bank detection circuit 135, the internal address generation circuit 136 and the data input/output circuit 137 which are illustrated in FIG. 2, the detailed descriptions thereof will be omitted herein.

Figure 14:
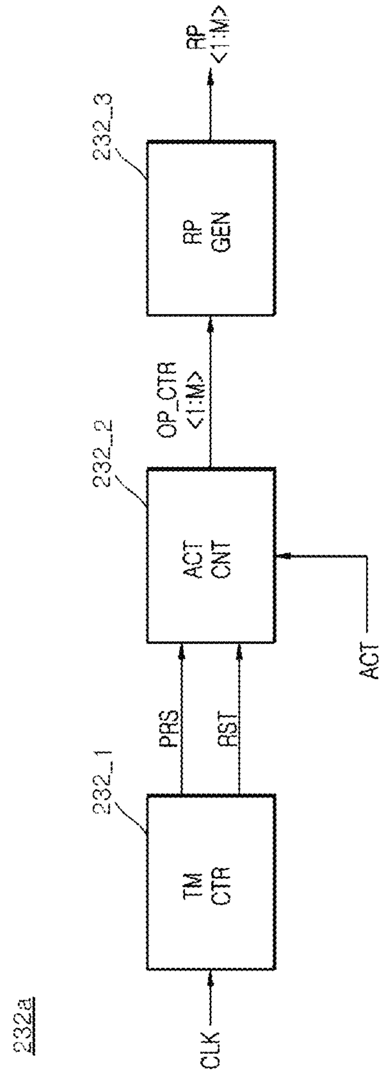
FIG. 14 is a block diagram illustrating a configuration based on an example of a refresh control circuit included in the controller illustrated in FIG. 13.

FIG. 14 is a block diagram illustrating a configuration of a refresh control circuit 232*a* based on an example of the refresh control circuit 232 included in the controller 23 illustrated in FIG. 13. The refresh control circuit 232*a* may include a test control circuit 232_1, an active counting circuit 232_2 and a refresh information generation circuit 232_3.

The test control circuit 232_1 may generate a period signal PRS and a reset signal RST on the basis of pulses of a clock CLK. The test control circuit 232_1 may generate the period signal PRS whenever the number of input pulses of the clock CLK corresponds to the number of input pulses in the test mode period. The test control circuit 232_1 may generate a first pulse of the period signal PRS when the number of input pulses of the clock CLK corresponds to the number of input pulses in the test mode period, and then generate a second pulse of the period signal PRS when the number of input pulses of the clock CLK after the first pulse is generated corresponds to the number of input pulses in the test mode period. The test control circuit 232_1 may generate the reset signal RST including a pulse which is generated when the period signal PRS is generated. The test mode period may be set to periods in which various numbers of clock pulses are input depending on embodiments.

The active counting circuit 232_2 may generate first to $M^{th}$ operation control signals OP_CTR<1:M> by counting the number of times that the active command ACT is input, on the basis of the pulses of the period signal PRS. The active counting circuit 232_2 may count the number of times that the active command ACT is input, from the point of time that the first pulse of the period signal PRS is input to the point of time that the second pulse of the period signal PRS is input. The active counting circuit 232_2 may generate the first to $M^{th}$ operation control signals OP_CTR<1:M>, when the input count of the active command ACT becomes equal to or more than a preset count. The active counting circuit 232_2 may reset the input count of the active command ACT when a pulse of the reset signal RST is input. The first to $M^{th}$ operation control signals OP_CTR<1:M> may be set to various number of bits depending on embodiments. The first to $M^{th}$ operation control signals OP_CTR<1:M> may include input count period information of the active command ACT. Since the active counting circuit 232_2 is implemented and operated in the same manner as the active counting circuit 132_2 illustrated in FIG. 4, the detailed descriptions thereof will be omitted herein.

The refresh information generation circuit 232_3 may generate the first to $M^{th}$ refresh information RP<1:M> on the basis of the first to $M^{th}$ operation control signals OP_CTR<1:M>. The refresh information generation circuit 232_3 may output the first to $M^{th}$ operation control signals OP_CTR<1:M> as the first to $M^{th}$ refresh information RP<1:M>. The number of bits contained in the first to $M^{th}$ refresh information RP<1:M> for adjusting the input period of the refresh command REF may be set to various values depending on embodiments.

FIG. 15 is a table for describing an input period tREF of the refresh command REF which is adjusted according to the input count of the active command ACT.

When the input count of the active command ACT corresponds to 30% of a preset count Max, the input period tREF of the refresh command REF is not adjusted. At this time, the refresh command REF applied to the semiconductor device 25 is input at every 64 ms (milliseconds) on the basis of a first refresh window of 64 ms, and input at every 32 ms on the basis of a second refresh window of 32 ms. At this time, when the input count of the active command ACT corresponds to 30% of the preset count Max, the active counting circuit 232_2 may generate the first operation control signal OP_CTR<1>.

When the input count of the active command ACT corresponds to 50% of the preset count Max, the input period tREF of the refresh command REF may be adjusted to (tREF)*0.9. At this time, the refresh command REF applied to the semiconductor device 25 is input at every 57.6 ms on the basis of the first refresh window of 64 ms, and input at every 28.8 ms on the basis of the second refresh window of 32 ms. When the input count of the active command ACT corresponds to 50% of the preset count Max, the active counting circuit 232_2 may generate the second operation control signal OP_CTR<2>.

When the input count of the active command ACT corresponds to 70% of the preset count Max, the input period tREF of the refresh command REF may be adjusted to (tREF)*0.8. At this time, the refresh command REF applied to the semiconductor device 25 is input at every 51.2 ms on the basis of the first refresh window of 64 ms, and input at every 25.6 ms on the basis of the second refresh window of 32 ms. When the input count of the active command ACT corresponds to 70% of the preset count Max, the active counting circuit 232_2 may generate the third operation control signal OP_CTR<3>.

When the input count of the active command ACT corresponds to 90% of the preset count Max, the input period tREF of the refresh command REF may be adjusted to (tREF)*0.6. At this time, the refresh command REF applied to the semiconductor device 25 is input at every 38.4 ms on the basis of the first refresh window of 64 ms, and input at every 19.2 ms on the basis of the second refresh window of 32 ms. When the input count of the active command ACT corresponds to 90% of the preset count Max, the active counting circuit 232_2 may generate the fourth operation control signal OP_CTR<4>.

When the input count of the active command ACT corresponds to the preset count Max, the input period tREF of the refresh command REF may be adjusted to (tREF)*0.5. At this time, the refresh command REF applied to the semiconductor device 25 is input at every 32 ms on the basis of the first refresh window of 64 ms, and input at every 16 ms on the basis of the second refresh window of 32 ms. When the input count of the active command ACT corresponds to the preset count Max, the active counting circuit 232_2 may generate the fifth operation control signal OP_CTR<5>.

Figure 16:
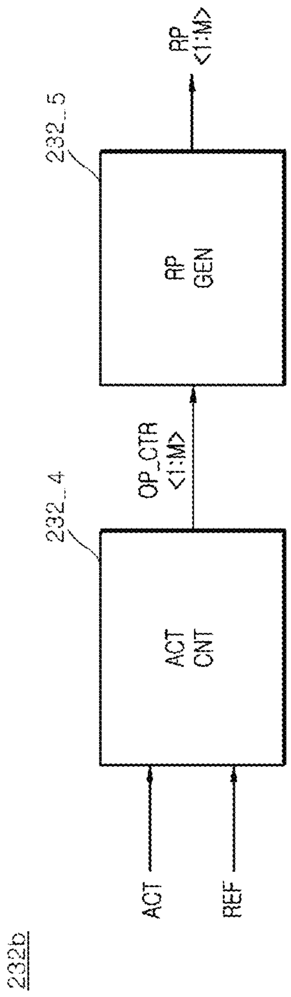
FIG. 16 is a block diagram illustrating a configuration based on another example of the refresh control circuit included in the controller illustrated in FIG. 13.

FIG. 16 is a block diagram illustrating a configuration of a refresh control circuit 232*b* based on another example of the refresh control circuit 232 included in the controller 23 illustrated in FIG. 13. The refresh control circuit 232*b* may include an active counting circuit 232_4 and a refresh information generation circuit 232_5.

The active counting circuit 232_4 may generate the first to $M^{th}$ operation control signals OP_CTR<1:M> by counting the number of times that the active command ACT is input, on the basis of the pulses of the refresh command REF. The active counting circuit 232_4 may count the number of times that the active command ACT is input, from the point of time that the first pulse of the refresh command REF is input to the point of time that the second pulse of the refresh command REF is input. The active counting circuit 232_4 may generate the first to $M^{th}$ operation control signals OP_CTR<1:M>, when the input count of the active command ACT is equal to or more than a preset count.

The refresh information generation circuit 232_5 may generate the first to $M^{th}$ refresh information RP<1:M> on the basis of the first to $M^{th}$ operation control signals OP_CTR<1:M>. The refresh information generation circuit 232_5 may output the first to $M^{th}$ operation control signals OP_CTR<1:M> as the first to $M^{th}$ refresh information RP<1:M>. The number of bits contained in the first to $M^{th}$ operation information OP<1:M> for adjusting the input count of the refresh command REF may be set to various values depending on embodiments.

Figure 17:
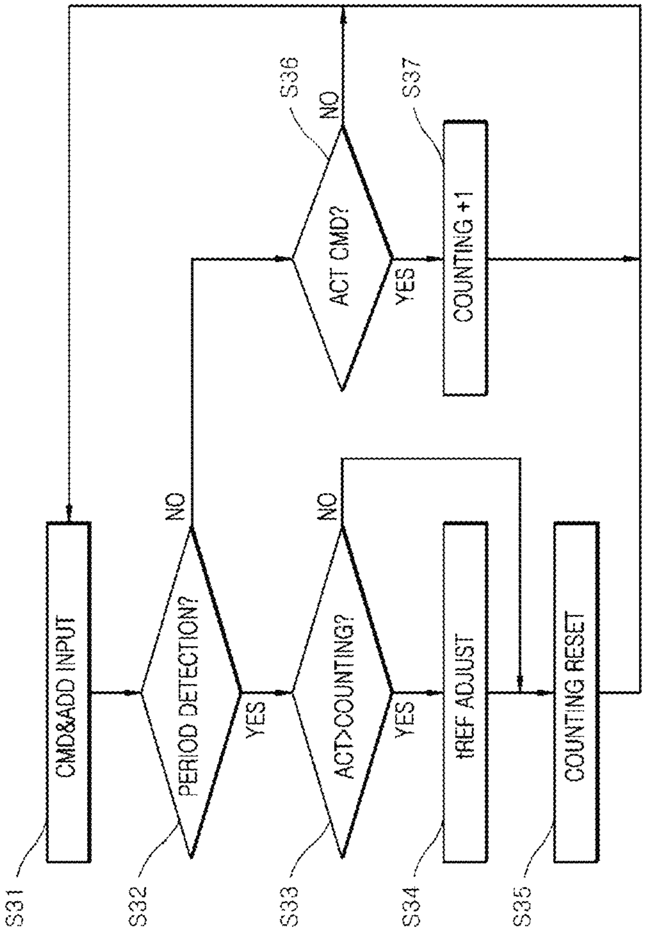
FIGS. 17 and 18 are flowcharts for describing a refresh period control operation of the semiconductor system in accordance with another embodiment.
Figure 18:
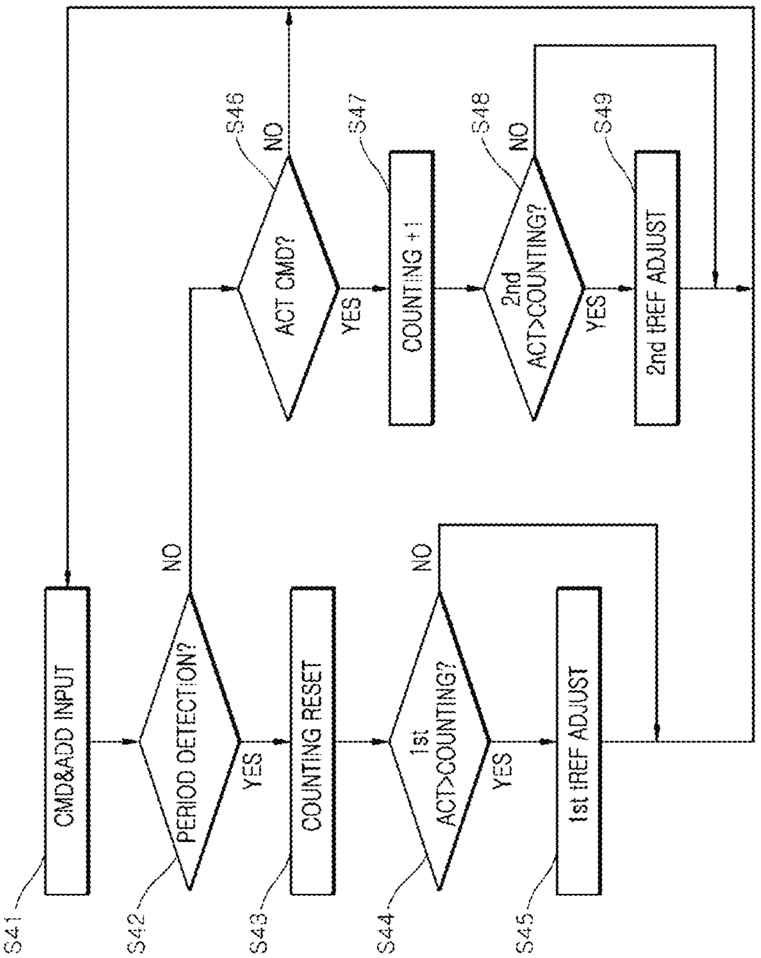

FIGS. 17 and 18 are flowcharts for describing a refresh period control method in accordance with an embodiment. The refresh period control method in accordance with the present embodiment will be described as follows with reference to FIG. 17.

The refresh period control method may include a command address input step S31, a period detection step S32, a comparison step S33, a refresh period adjusting step S34, a reset step S35, an active detection step S36 and a counting step S37.

The command address input step S31 may be set to a step in which the host 21 applies the command CMD and the address ADD to the controller 23.

The period detection step S32 may be set to a step in which the test control circuit 232_1 detects a pulse of the period signal PRS, which is generated on the basis of a pulse of the clock CLK. When the pulse of the period signal PRS is generated in the period detection step S32 (YES), the procedure may proceed to the comparison step S33. When the pulse of the period signal PRS is not generated in the period detection step S22 (NO), the procedure may proceed to the active detection step S36.

The comparison step S33 may be set to a step of detecting the number of times that the active command ACT generated from the command CMD is input during the test mode period. When the input count of the active command ACT is equal to or more than the preset count in the comparison step S33 (YES), the procedure may proceed to the refresh period adjusting step S34. In the comparison step S33, the active counting circuit 232_2 may count the number of times that the active command ACT is input, from the point of time that the first pulse of the period signal PRS is input to the point of time that the second pulse of the period signal PRS is input. When the input count of the active command ACT is equal to or more than the preset count, the active counting circuit 232_2 may generate the first to $M^{th}$ operation control signals OP_CTR<1:M>. When the input count of the active command ACT is less than the preset count in the comparison step S33 (NO), the procedure may proceed to the reset step S35.

The refresh period adjusting step S34 may be set to a step of adjusting the input period tREF of the refresh command REF, when the input count of the active command ACT is equal to or more than the preset count (YES). In the refresh period adjusting step S34, the refresh information generation circuit 232_3 may generate the first to $M^{th}$ refresh information RP<1:M> on the basis of the first to $M^{th}$ operation control signals OP_CTR<1:M>. In the refresh period adjusting step S34, the command generation circuit 231 may increase the input period of the refresh command REF on the basis of the first to $M^{th}$ refresh information RP<1:M>.

The reset step S35 may be set to a step of resetting the input count of the active command ACT. In the reset step S35, the test control circuit 232_1 may generate the reset signal RST including a pulse which is generated when the period signal PRS is generated. In the reset step S35, the active counting circuit 232_2 may reset the input count of the active command ACT when a pulse of the reset signal RST is input. After the input count of the active command ACT is reset in the reset step S35, the procedure may return to the command address input step S31.

The active detection step S36 may be set to a step of detecting that the active command ACT is generated on the basis of the command CMD. When the active command ACT is generated in the active detection step S36 (YES), the procedure may proceed to the counting step S37. In the active detection step S36, the command generation circuit 231 may generate the active command ACT on the basis of the command CMD. When the active command ACT is not generated in the active detection step S36 (NO), the procedure may return to the command address input step S31.

The counting step S37 may be set to a step of counting an input of the active command ACT. In the counting step S37, the active counting circuit 232_2 may up-count the input of the active command ACT by 1. After the input of the active command ACT is up-counted by 1 in the counting step S37, the procedure may return to the command address input step S31.

The refresh period control method in accordance with the present embodiment may increase the input period of the refresh command when the input count of the active command is equal to or more than the preset count, thereby reducing the interference between adjacent word lines. Furthermore, the refresh period control method in accordance with the present embodiment may adjust the input period of the refresh command according to the input count of the active command, thereby preventing data loss.

The refresh period control method in accordance with the present embodiment will be described as follows with reference to FIG. 18.

The refresh period control method may include a command address input step S41, a period detection step S42, a first reset step S43, a first comparison step S44, a first refresh period adjusting step S45, an active detection step S46, a counting step S47, a second comparison step S48 and a second refresh period adjusting step S49.

The command address input step S41 may be set to a step in which the host 21 applies the command CMD and the address ADD to the controller 23.

The period detection step S42 may be set to a step in which the test control circuit 232_1 detects a pulse of the period signal PRS, which is generated on the basis of a pulse of the clock CLK. When the pulse of the period signal PRS is generated in the period detection step S42 (YES), the procedure may proceed to the first reset step S43. When the pulse of the period signal PRS is not generated in the period detection step S42 (NO), the procedure may proceed to the active detection step S46.

The first reset step S43 may be set to a step of resetting the input count of the active command ACT. In the first reset step S35, the test control circuit 232_1 may generate the reset signal RST including a pulse which is generated when the period signal PRS is generated. In the reset step S43, the active counting circuit 232_2 may reset the input count of the active command ACT when a pulse of the reset signal RST is input. After the input count of the active command ACT is reset in the first reset step S43, the procedure may proceed to the first comparison step S44.

The first comparison step S44 may be set to a step of detecting the input count of the active command ACT before the resetting of the input count in the first reset step S43. When the input count of the active command ACT before the resetting of the input count in the first reset step S43 is equal to or more than the preset count in the first comparison step S44 (YES), the procedure may proceed to the first refresh period adjusting step S45. In the first comparison step S44, the active counting circuit 232_2 may generate the first to $M^{th}$ operation control signals OP_CTR<1:M>, when the input count of the active command ACT before the resetting of the input count in the first reset step S43 is equal to or more than the preset count. When the input count of the active command ACT is less than the preset count in the first comparison step S44 (NO), the procedure may return to the command address input step S41.

The first refresh period adjusting step S45 may be set to a step of adjusting the input period tREF of the refresh command REF, when the input count of the active command ACT is equal to or more than the preset count (YES). In the first refresh period adjusting step S45, the refresh information generation circuit 232_3 may generate the first to $M^{th}$ refresh information RP<1:M> on the basis of the first to $M^{th}$ operation control signals OP_CTR<1:M>. In the first refresh period adjusting step S45, the command generation circuit 231 may increase the input period of the refresh command REF on the basis of the first to $M^{th}$ refresh information RP<1:M>. After the first refresh period adjusting step S45 is ended, the procedure may return to the command address input step S41.

The active detection step S46 may be set to a step of detecting that the active command ACT is generated on the basis of the command CMD. When the active command ACT is generated in the active detection step S46 (YES), the procedure may proceed to the counting step S47. In the active detection step S46, the command generation circuit 231 may generate the active command ACT on the basis of the command CMD. When the active command ACT is not generated in the active detection step S46 (NO), the procedure may return to the command address input step S41.

The counting step S47 may be set to a step of counting an input of the active command ACT. In the counting step S47, the active counting circuit 232_2 may up-count the input of the active command ACT by 1. After the input of the active command ACT is up-counted by 1 in the counting step S47, the procedure may proceed to the second comparison step S48.

The second comparison step S48 may be set to a step of detecting the input count of the active command ACT in the counting step S47. When the input count of the active command ACT in the counting step S47 is equal to or more than the preset count in the second comparison step S48 (YES), the procedure may proceed to the second refresh period adjusting step S49. In the second comparison step S48, the active counting circuit 232_2 may generate the first to $M^{th}$ operation control signals OP_CTR<1:M>, when the input count of the active command ACT in the counting step S47 is equal to or more than the preset count. When the input count of the active command ACT is less than the preset count in the second comparison step S48 (NO), the procedure may return to the command address input step S41.

The second refresh period adjusting step S49 may be set to a step of adjusting the input period tREF of the refresh command REF, when the input count of the active command ACT is equal to or more than the preset count (YES). In the second refresh period adjusting step S49, the refresh information generation circuit 232_3 may generate the first to $M^{th}$ refresh information RP<1:M> on the basis of the first to $M^{th}$ operation control signals OP_CTR<1:M>. In the second refresh period adjusting step S49, the command generation circuit 231 may increase the input period of the refresh command REF on the basis of the first to $M^{th}$ refresh information RP<1:M>. After the second refresh period adjusting step S49 is ended, the procedure may return to the command address input step S41.

The refresh period control method in accordance with the present embodiment may increase the input period of the refresh command when the input count of the active command is equal to or more than the preset count, thereby reducing the interference between adjacent word lines. Furthermore, the refresh period control method in accordance with the present embodiment may adjust the input period of the refresh command according to the input count of the active command, thereby preventing data loss.

Although embodiments have been disclosed for illustrative purposes, those skilled in the art will appreciate that various modifications, additions and substitutions are possible, without departing from the scope and spirit of the embodiments as defined in the accompanying claims.

What is claimed is:

1. A semiconductor system comprising:
- an active counting circuit configured to store a counting signal generated by counting the number of times that an active command is input during a test mode period, and generate an operation control signal for adjusting an operation period when an input count of the active command is equal to or more than a preset count;
- an operation information generation circuit configured to receive the operation control signal, and generate operation information for adjusting the operation period; and
- a test control circuit configured to generate a reset signal for resetting the counting signal when the test mode period is ended, and
- wherein the operation period set to a time period from a point of time that the active command is generated to a point of time that a precharge command is generated,
- wherein the test mode period is set to a constant time period.

2. The semiconductor system of claim 1, wherein the active counting circuit comprises:
- a counter configured to generate the counting signal by counting the number of times that the active command is input, from a point of time that a first pulse of a period signal is input to a point of time that a second pulse of the period signal is input, store the generated counting signal, and reset the counting signal when the reset signal is input; and
- a comparison circuit configured to generate the operation control signal by comparing the counting signal and a comparison signal.

3. The semiconductor system of claim 1, wherein the test control circuit generates a pulse of the period signal for setting the test mode period.

4. An active period control method comprising:
- detecting an input count of an active command, when a pulse of a period signal for setting a test mode period is generated;
- adjusting an operation period when the input count of the active command is equal to or more than a preset count; and
- resetting the input count of the active command when the test mode period is ended; and
- wherein the operation period set to a time period from a point of time that the active command is generated to a point of time that a precharge command is generated;
- wherein the test mode period is set to a constant time period.

5. The active period control method of claim 4, further comprising:
- detecting that the active command is generated, when the pulse of the period signal for setting the test mode period is not generated; and
- counting the number of times that the active command is input.

* * * * *